United States Patent [19]

Ogawa

[11] Patent Number: 4,710,311
[45] Date of Patent: Dec. 1, 1987

[54] PIEZOELECTRIC CERAMIC COMPOSITION

[75] Inventor: Toshio Ogawa, Kyoto, Japan

[73] Assignee: Murata Manufacturing Co., Ltd., Japan

[21] Appl. No.: 849,026

[22] Filed: Apr. 7, 1986

[30] Foreign Application Priority Data

Apr. 11, 1985 [JP] Japan ................................. 60-78088

[51] Int. Cl.$^4$ ............................................. C04B 35/49
[52] U.S. Cl. ................................... 252/62.9; 501/134
[58] Field of Search ..................... 501/134, 135, 136; 252/62.9

[56] References Cited

U.S. PATENT DOCUMENTS

| | | | |
|---|---|---|---|
| 3,970,572 | 7/1976 | Ogawa et al. | 252/62.9 |
| 4,230,589 | 10/1980 | Ogawa | 252/62.9 |
| 4,255,272 | 3/1981 | Ogawa | 252/62.9 |
| 4,392,970 | 7/1983 | Ouchi et al. | 252/62.9 |

FOREIGN PATENT DOCUMENTS

| | | | |
|---|---|---|---|
| 53-43900 | 4/1978 | Japan | 501/134 |
| 57-106570 | 7/1982 | Japan | 501/136 |
| 635071 | 11/1978 | U.S.S.R. | 501/134 |

*Primary Examiner*—William R. Dixon, Jr.
*Assistant Examiner*—A. Knab
*Attorney, Agent, or Firm*—Ostrolenk, Faber, Gerb & Soffen

[57] ABSTRACT

A piezoelectric ceramic composition consists essentially of a main component consisting of lanthanum modified lead titanate and lead stanate antimonate, and an auxiliary component consisting of manganese oxide. The content of the main component is 98 to 99.0 mole % when expressed by the general formula:

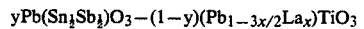

$$yPb(Sn_{\frac{1}{2}}Sb_{\frac{1}{2}})O_3 - (1-y)(Pb_{1-3x/2}La_x)TiO_3$$

(where $0.01 \leq x \leq 0.06$ and $0.01 \leq y \leq 0.06$), and the content of the manganese oxide is 0.1 to 2 mole % when converted into an amount of $MnO_2$.

1 Claim, No Drawings

PIEZOELECTRIC CERAMIC COMPOSITION

FIELD OF THE INVENTION

This invention relates to a piezoelectric ceramic composition and, more particularly, to piezoelectric ceramic composition with a stable piezoelectric characteristics even at high temperatures.

BACKGROUND OF THE INVENTION

There have been known various piezoelectric ceramic compositions such as, for example, those comprising $PbTiO_3$ as a main component, or those containing $Pb(Ti,Zr)O_3$ as a main component, or their modified solid solutions containing $Pb(Mn_{1/3}Nb_{2/3})$ and/or $Pb(Ni_{1/3}Nb_{2/3})O_3$ as the second or third component. Among them, the compositions of the binary or ternary system containing $Pb(Ti,Zr)O_3$ as the main component have been used for piezoelectric vibrators, resonators, oscillating elements, ceramic filters, surface acoustic wave filters, pyroelectric elements since they can be improved in piezoelectric and electric characteristics by incorporating additives.

Recently, there have been proposed piezoelectric ceramic compositions of $PbTiO_3$ with minor substitution of Pb site. Such ceramics have low dielectric constant and higher electromechanical coupling coefficient in thickness vibration mode than that in the radial expansion mode. However, these ceramic compositions of the $PbTiO_3$ system, more particularly, a ceramic composition consisting of $(Pb_{1-3x/2}La_x)TiO_3$ and an additive of $MnO_2$, has a serious disadvantage that dielectric breakdown takes place when polarized at high temperature and high voltage. This causes increase in the fraction defective. Also, if such ceramic elements are allowed to stand at high temperatures, it causes deterioration in the piezoelectric characteristics and electric characteristics.

SUMMARY OF THE INVENTION

It is therefore an object of the present invention to provide a piezoelectric ceramic composition which does not show dielectric breakdown even if polarized at high temperatures and high voltage.

Another object of the present invention is to provide a piezoelectric ceramic composition which shows stable characteristics even at elevated temperatures.

Another object of the present invention is to provide a piezoelectric ceramic composition with a high resistance to dielectric breakdown, a high curie point of not less than 400° C., excellent aging characteristics at elevated temperatures, and a high electromechanical coupling coefficient in thickness vibration mode of not less than 40%.

According to the present invention there is provided a piezoelectric ceramic composition consisting essentially of a main component consisting of lanthanum modified lead titanate and lead stanate antimonate, and an auxiliary component consisting of manganese oxide, the composition containing 98 to 99.9 mole % of the main component when expressed by the general formula:

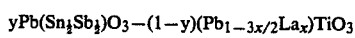

$yPb(Sn_{\frac{1}{2}}Sb_{\frac{1}{2}})O_3 - (1-y)(Pb_{1-3x/2}La_x)TiO_3$ (where $0.01 \leq x \leq 0.06$ and $0.01 \leq y \leq 0.06$), and 0.1 to 2 mole % of manganese oxide when converted into an amount of $MnO_2$.

In the composition of the present invention the contents of the main and auxiliary components have been limited as being in the above respective ranges for the following reasons. If the content of the main component is less than 0.98 mole %, or if the content of the auxiliary component is more than 2 mole %, the electromechanical coupling coefficient in the thickness vibration mode becomes lowered and takes a value less than 40%, and also other piezoelectric characteristics become lowered. If the content of the main component is more than 99.9 mole %, or if the content of the auxiliary component is less than 0.1 mole %, the electromechanical coupling coefficient in the thickness vibration mode becomes lowered, as well as the above case, and takes a value less than 40%, and the other piezoelectric characteristics become lowered. Thus, it is impossible to put the ceramic into practical use. The addition of manganese oxide contributes to improve the electromechanical coupling coefficient in the thickness vibration mode (Kt) and makes it possible to obtain Kt of not less than 40%.

In the main component, the values of x and y have been limited as being in the above range for the following reasons. If the value of x is less than 0.01, or the value of y is less than 0.01, it causes dielectric breakdown of the ceramics when polarized at an elevated temperature and high voltage. If x takes a value exceeding 0.06, or y takes a value exceeding 0.06, Curie temperature becomes lowered and takes a value of less than 400° C. Also, the piezoelectric characteristics and electric characteristics at elevated temperatures become deteriorated.

The piezoelectric ceramic composition according to the present invention has a high Curie temperature of not less than 400° C., excellent heat aging characteristics at high temperatures, and a electromechanical coupling coefficient in the thickness vibration mode of not less than 40%. Thus, the piezoelectric ceramic composition of the present invention can be applied to piezoelectric vibrators, resonators, oscillating elements, ceramic filters and pyroelectric elements.

The invention will be further apparent from the following description with reference to examples thereof.

EXAMPLES

As raw materials, there were used PbO (or $Pb_3O_4$), $SnO_2$, $Sb_2O_3$, $La_2O_3$, $TiO_2$ and $MnO_2$. The raw materials were weighed to prepare a mixture of which the final product has a composition shown in Table 1, and then milled in a pot mill by the wet process. The mixture was then dehydrated, dried and calcined at 850° to 1100° C. for 2 hours. The calcined body was crushed, milled with an organic binder, dried, and then granulated. The resultant granular was pressed into disks with a diameter of 20 mm and a thickness of 1.0 mm at a pressure of 1000 Kg/cm².

The disks were fired at a temperature of 1150° to 1250° C. for 2 hours to prepare ceramic disks. The resultant ceramic disks were provided with electrodes by applying silver paste on their both sides and baking the same at 800° C. for 30 minutes, and then polarized in an insulating oil by applying a direct current voltage of 10 Kv/mm at 200° C. for 10 minutes.

The polarized ceramic disks were subjected to measurements of dielectric and electric characteristics. The measurements were made on Curie temperature (°C.), dielectric constant ($\epsilon_r$), electromechanical coupling coefficient in thickness vibration mode (Kt), and mechanical quality factor in thickness vibration mode (Qmt), and heat aging characteristic on electromechanical coupling coefficient in thickness vibration mode. The results are shown in Table 1.

The heat aging characteristics were determined by a change rate of electromechanical coupling coefficient in thickness vibration mode (Kt) measured before and after heating the specimens under the conditions of 300° C. for 1 hour.

Apart from the above, the ceramic disks having the compositions Nos. 3, 4, 6, 9, 11, 12, 14, 15, 17 and 19 were respectively polarized under the conditions shown in Table 2 to determine the dielectric breakdown characteristics at elevated temperatures and high voltage. Results are shown in Table 2.

In the tables, asterisked specimens are those having the composition beyond the scope of the present invention, whereas other specimens are those falling within the scope of the present invention.

[Pb(Sn$_{\frac{1}{2}}$Sb$_{\frac{1}{2}}$)O$_3$] and lanthanum modified lead titanate. Also the present invention makes it possible to obtain piezoelectric ceramic compositions with a curie temperature of not less than 400 °C., excellent heat aging characteristics at elevated temperatures, and high electromechanical coupling coefficient in the thickness vibration mode (Kt) of not less than 40%.

In the above examples, respective oxides of the elements have been used as the raw materials, there may be used any other compounds of the respective elements which finally provide the corresponding oxides. For example, carbonates of the respective elements such as, for example, $MnCO_3$ for manganese oxide may be used as the raw materials.

What I claim is:

1. A piezoelectric ceramic composition consisting essentially of a main component consisting of lanthanum modified lead titanate and lead stanate antimonate, and an auxiliary component consisting of manganese oxide, the composition containing 98 to 99.9 mole % of the main component when expressed by the general formula:

TABLE 1

| Specimen No. | main | x | y | (mole) MnO$_2$ | Curie point (°C.) | $\epsilon_r$ | Kt (%) | Qmt | heat aging (%) |
|---|---|---|---|---|---|---|---|---|---|
| 1 | 0.999 | 0.01 | 0.01 | 0.001 | 475 | 157 | 45 | 155 | −0.6 |
| 2 | 0.98 | 0.01 | 0.06 | 0.02 | 470 | 163 | 44 | 183 | −0.4 |
| 3* | 0.99 | 0.01 | 0.00 | 0.01 | 470 | 165 | 44 | 151 | −1.0 |
| 4* | 0.99 | 0.00 | 0.01 | 0.01 | 475 | 159 | 47 | 103 | −1.0 |
| 5 | 0.99 | 0.025 | 0.01 | 0.01 | 445 | 174 | 46 | 197 | −0.8 |
| 6* | 1.00 | 0.025 | 0.03 | 0.00 | 450 | 170 | 38 | 90 | −0.9 |
| 7 | 0.99 | 0.025 | 0.03 | 0.001 | 450 | 172 | 47 | 218 | −0.7 |
| 8 | 0.99 | 0.025 | 0.03 | 0.01 | 450 | 173 | 49 | 233 | −1.0 |
| 9 | 0.99 | 0.025 | 0.06 | 0.01 | 445 | 180 | 48 | 247 | −1.0 |
| 10 | 0.98 | 0.025 | 0.06 | 0.02 | 445 | 178 | 51 | 250 | −1.1 |
| 11* | 0.99 | 0.025 | 0.00 | 0.01 | 440 | 185 | 47 | 204 | −2.5 |
| 12* | 0.99 | 0.00 | 0.03 | 0.01 | 430 | 190 | 55 | 253 | −1.2 |
| 13 | 0.99 | 0.04 | 0.03 | 0.01 | 430 | 192 | 58 | 300 | −1.3 |
| 14 | 0.98 | 0.04 | 0.03 | 0.02 | 430 | 195 | 56 | 291 | −1.1 |
| 15* | 0.99 | 0.04 | 0.00 | 0.01 | 425 | 200 | 53 | 218 | −4.8 |
| 16* | 0.975 | 0.04 | 0.06 | 0.025 | 430 | 197 | 36 | 166 | −5.7 |
| 17 | 0.99 | 0.06 | 0.01 | 0.01 | 400 | 205 | 50 | 287 | −4.3 |
| 18* | 0.98 | 0.06 | 0.07 | 0.02 | 370 | 248 | 47 | 295 | −10 |
| 19* | 0.98 | 0.06 | 0.00 | 0.02 | 360 | 250 | 48 | 307 | −18 |
| 20* | 0.99 | 0.07 | 0.03 | 0.01 | 370 | 231 | 46 | 314 | −12 |

TABLE 2

| Poling conditions | | | Number of specimens (pieces) | Numbers of breakdown (pieces) (incidence of breakdown: %) Specimen No. | | | | | | | | | |
|---|---|---|---|---|---|---|---|---|---|---|---|---|---|
| Temp. (°C.) | Voltage (Kv/mm) | Time (min) | | 3* | 4* | 6* | 8 | 9 | 11* | 12* | 14 | 15* | 17 | 19* |
| 150 | 5 | 30 | 100 | 2 (2) | 0 (0) | 0 (0) | 0 (0) | 0 (0) | 0 (0) | 1 (1) | 0 (0) | 2 (2) | 0 (0) | 3 (3) |
| 150 | 10 | 30 | 150 | 12 (8) | 10 (7) | 0 (0) | 0 (0) | 0 (0) | 17 (11) | 15 (10) | 0 (0) | 18 (2) | 0 (0) | 11 (7) |
| 100 | 15 | 30 | 200 | 50 (25) | 45 (23) | 1 (0.5) | 0 (0) | 0 (0) | 66 (33) | 60 (30) | 1 (0.5) | 73 (37) | 0 (0) | 53 (27) |
| 200 | 5 | 10 | 100 | 18 (18) | 13 (13) | 0 (0) | 0 (0) | 0 (0) | 20 (20) | 16 (16) | 0 (0) | 15 (15) | 0 (0) | 16 (16) |
| 200 | 10 | 10 | 150 | 30 (20) | 28 (19) | 1 (0.7) | 0 (0) | 1 (0.7) | 37 (25) | 33 (22) | 0 (0) | 39 (26) | 0 (0) | 42 (28) |
| 200 | 10 | 30 | 150 | 72 (48) | 66 (44) | 1 (0.7) | 1 (0.7) | 1 (0.7) | 81 (54) | 84 (56) | 0 (0) | 102 (68) | 1 (0.7) | 95 (63) |
| 200 | 15 | 10 | 200 | 130 (65) | 105 (53) | 2 (1) | 0 (0) | 1 (0.5) | 123 (62) | 126 (63) | 1 (0.5) | 148 (74) | 1 (0.5) | 102 (81) |
| 200 | 15 | 30 | 200 | 170 (85) | 148 (74) | 3 (1.5) | 1 (0.5) | 2 (1) | 154 (77) | 163 (82) | 2 (1) | 172 (86) | 1 (0.5) | 188 (94) |

As can be seen from the results shown in Tables 1 and 2, according to the present invention it is possible to obtain piezoelectric ceramic compositions which scarcely show dielectric breakdown even if polarized at elevated temperatures and high voltage. This effect is considered to be caused by the coexistence of lead stanate antimonate having a pyrochrore crystal structure

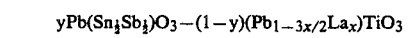

(where $0.01 \leq x \leq 0.06$ and $0.01 \leq y \leq 0.06$), and 0.1 to 2 mole % of manganese oxide when converted into an amount of $MnO_2$.

* * * * *